United States Patent [19]

Falco

[11] 3,872,331

[45] Mar. 18, 1975

[54] PACKAGED SURFACE WAVE SELECTIVE CIRCUIT DEVICE AND METHOD OF MAKING THE SAME

[75] Inventor: Guy N. Falco, Schaumburg, Ill.

[73] Assignee: Zenith Radio Corporation, Chicago, Ill.

[22] Filed: June 4, 1973

[21] Appl. No.: 366,811

[52] U.S. Cl. ........... 310/9.4, 174/52 S, 174/DIG. 3, 310/8.2, 317/101 CP, 333/30

[51] Int. Cl. ............................................ H01r 7/00

[58] Field of Search .......... 174/DIG. 3, 52 PE, 52 S, 174/50.54, 50.61; 310/8.2, 8.3, 8.9, 9.1, 9.8; 333/72, 130

[56] References Cited

UNITED STATES PATENTS

| | | | |
|---|---|---|---|
| 2,881,336 | 4/1959 | Elion | 310/8.2 |
| 3,271,625 | 9/1966 | Caracciolo | 174/DIG. 3 UR |
| 3,573,673 | 4/1971 | DeVries et al. | 333/72 |

*Primary Examiner*—Darrell L. Clay
*Attorney, Agent, or Firm*—John J. Pederson; Nicholas A. Camasto

[57] ABSTRACT

Semiconductor packaging structures and methods are modified to permit packaging of surface wave selective devices to provide convenient electrical and mechanical interfacing. Distinctive reference locations are included for the precision location of the surface wave device within the container. A gasket, having integral dampening elements which supply end region attenuation of the surface waves, is employed to provide a seal for the container.

6 Claims, 2 Drawing Figures

PACKAGED SURFACE WAVE SELECTIVE CIRCUIT DEVICE AND METHOD OF MAKING THE SAME

BACKGROUND OF THE INVENTION

This invention relates to the packaging of surface wave selective devices which permits convenient electrical and mechanical interfacing. The properties of the acoustic surface wave transducers make them suitable for use in a number of applications as electronic amplifiers and delay lines. Additional uses for such devices are being discovered, but to date no convenient packaging configurations have been disclosed.

The prior art for semiconductor packaging shows the several methods of printing metallized patterned areas on green ceramic plates, coining to form multi-level containers and heating to cure the ceramic and fuse the metallized areas. These may be exemplified by U.S. Pat. No. 3,520,054 (1970) to Pensak and Hillman. The ceramic composition, process mixes, temperatures, and temperature cycles are well known to those skilled in the art. A full description of the forming process for ceramic material and printing with conductive inks along with the required temperatures and chemical compositions is disclosed in U.S. Pat. No. 3,458,930 (1969) to Melkeraaen and Capek assigned to the assignee of the present invention. Thus, the techniques for producing multi-level electrically interconnected ceramic containers constitute a portion of the known semiconductor packaging art.

Many of the structural and environmental requirements of a package for surface wave devices are similar to those generally required for semiconductor devices. Examples of such requirements are: rigidity for device protection, capability of interfacing with associated circuitry and hermetic container seal. However, the use of normal semiconductor packaging techniques creates problems which are directly related to the surface wave device's operational characteristics.

The normal semiconductor packaging techniques do not require the precision placement of a device within the container. Generally, any possible contact with the walls of the container would cause difficulty only if electrical contact were thereby established, and this can usually be prevented by the use of protective insulating coatings. Surface wave devices have transducer electrodes, normally interdigitated, mounted on a piezoelectric substrate for transducing electrical signals into acoustic surface oscillations. Physical contact between the surface of the substrate and the walls of a container or contact with potting or any other material can produce distortions in the wave propagation pattern, thus modifying the signal derived at the output transducer electrodes. Therefore, the packaging of such devices must include provisions for the precision positioning of the device within a container so as to prevent any physical contact with the crucial transmission surface.

The proper operation of surface wave selective devices further requires that the end regions of the transducer surface be modified to progressively diminish the traveling wave to prevent its subsequent reflection. The present known method of modification consists of applying a wax-like material in a predetermined pattern and allowing it to solidify on the end regions of the critical surface. This mass dampening method lacks effectiveness of operation because of the output interference resulting from the reflections which continue to occur in the end region and reflections which occur at the wax material — critical surface interface. Moreover, reproduceability in application of the material is difficult to achieve thereby preventing the production of surface wave devices with uniform operational characteristics.

OBJECTS OF THE INVENTION

One of the objects of this invention is to provide a method for packaging surface wave selective devices.

An additional object of this invention is to provide a new and improved selective circuit device adapted for electrical and mechanical interfacing with external circuit devices.

A further object of this invention is to provide a method of packaging and a structure which result in diminished end reflections for surface wave devices.

SUMMARY OF THE INVENTION

This invention concerns a packaging method and a package structure for surface wave selective devices. The method consists of printing conductive material on unprocessed ceramic material, forming that material into a multi-layer electrically interconnected plate and having a recess and at least two measurement reference locations. The plate is cured and the conductive material fused. A surface wave device is placed in the recess, attached with conductive epoxy without contacting the critical surface, and electrically connected. A gasket having integral dampening elements and containing thermally responsive bonding material is aligned with respect to the reference locations to overlie the device in a predetermined manner. A cover plate is then positioned relative to the reference locations in contact with the gasket to enclose the recess. Heat is applied to seal the cover and cause bonding of the dampening elements to the surface of the device.

The structure includes the multi-level electrically interconnected container plate which includes the distinctive reference locations. A surface wave selective device is conductively bonded to the base of the recess forming a ground plane and positioned to allow clearance between the operational surface of the device and the walls of the container recess. The input and output terminals of the surface wave device are electrically connected to conductive patterns extending from the recess to the edge of a major surface of the container plate. A cover plate is bonded to the container plate to enclose the recess without interfering with access to a portion of the conductive areas. The preferred embodiment of the structure includes a formed gasket having integral inwardly extending dampening elements contacting the surface wave selective device providing dampening of the surface wave. The gasket preferably consists of a mat of random fibrous material having a thermally responsive sealing material dispersed within it.

BRIEF DESCRIPTION OF THE DRAWING

The features of the invention which are believed to be novel are set forth with particularity in the appended claims. The invention, together with further objects and advantages thereof, may best be understood, however, by reference to the following description taken in conjunction with the accompanying drawing in which like reference numerals identify like elements, and in which;

DESCRIPTION OF THE PREFERRED EMBODIMENT

Figure 1:
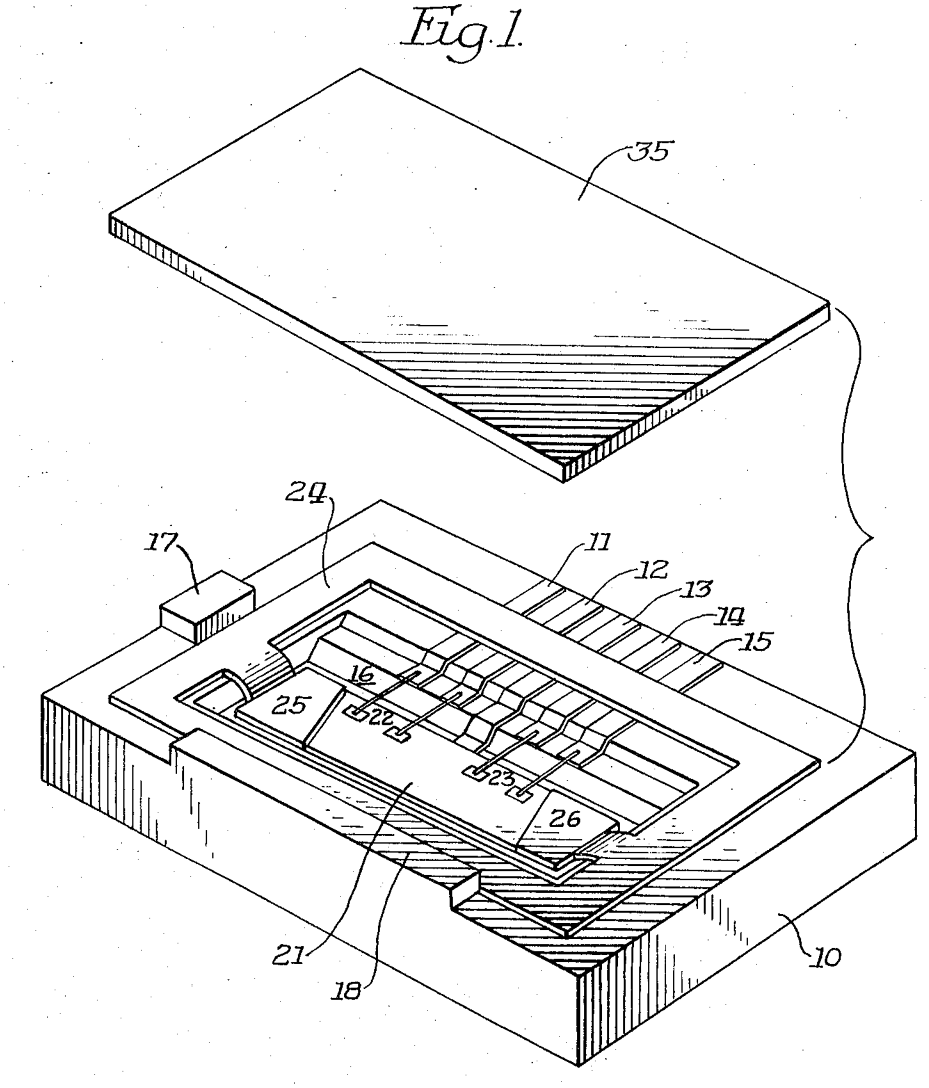
FIG. 1 shows in an exploded view a dampening gasket in position in a ceramic container.

FIG. 1 shows a multi-level formed ceramic container plate 10 on which has been fused a plurality of conductive patterned areas 11–15 which extend into recess 16. One of these conductive areas 13 extends from the edge of the container plate 10 and interconnects with a rectangular pattern (not shown) on the base of recess 16 which forms a ground plane.

The printing of conductive areas on uncured ceramic and the forming of a multi-layered structure along with the various chemical compositions and required temperature cycles including the process of raising the temperature to both cure the ceramic and fuse the conductive areas thereto are fully disclosed in U.S. Pat. No. 3,458,930 by Melkeraaen et al and assigned to the assignee of the present invention. These disclosures are incorporated by reference into this application.

The ceramic plate has at least two distinctive raised indexing pads 17 and 18 which constitute the reference locations. In a modification of the process by which the green ceramic is formed to produce a multi-layer recessed plate, pressure is applied by the forming die causing ceramic material to flow into cavities in the die to produce the raised pads.

A surface wave device 21 is shown in position in the recess of container plate. The crucial operational surface having pairs of input and output terminals 22 and 23 is shown. However, no transducer electrode configurations are shown on this surface since this invention will function with all such configurations. The device is positioned relative to the indexing pads so that there is no interference between the crucial surface of the device and any portion of the container. The normal method of conductively bonding the base of the surface wave device to the ground plane located in recess 16 is to use conductive epoxy, although a preform with a thermosetting conductive material may also be used.

The surface wave device has pairs of input and output terminals 22 and 23 shown interconnected with the printed conductive areas 11, 12 and 14, 15, respectively. The preferred electrical connection method is to use a ball bonding operation both at the terminals and the conductive areas, although any other bonding techniques may be used.

Figure 2:
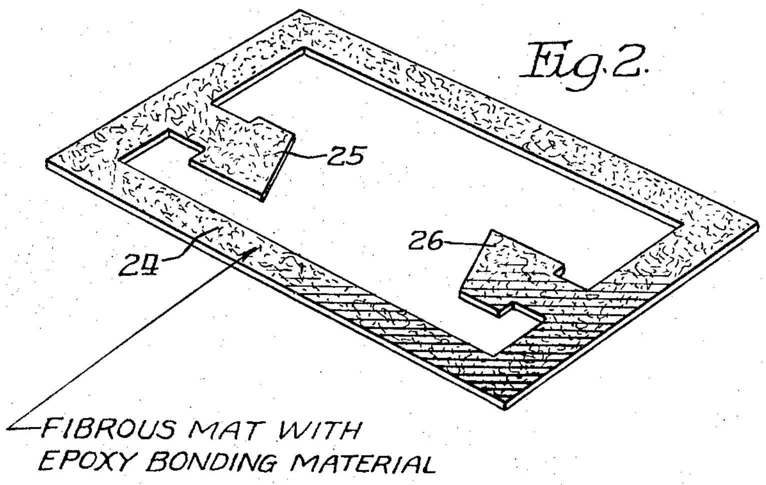
FIG. 2 shows the dampening gasket in a planar relationship.

Preformed gasket 24 is shown in position aligned with reference to pads 17 and 18. This gasket is provided with integral inwardly projecting elements 25 and 26 shown in contact with the end regions of the surface wave device 21. The geometry of the end tabs and their actual dimensions depend upon the electrode configuration of a particular surface wave device. FIG. 2 shows the preformed gasket in a planar relationship. This is the configuration it would have after having been die cut and prior to being positioned on the ceramic container. The dimensions of the preformed gasket are such that when it is positioned with reference to tabs 17 and 18, the end dampening elements 25 and 26 overlie the surface wave device 21 and sag into a predetermined alignment, as shown in FIG. 1. This provides the proper geometric relationship for dampening end reflections when the dampening elements are subsequently bonded to the surface wave device.

Normally, the open area defined by the tabs constitutes a parallelogram, but it may take different geometric configurations which are designed to reduce the effect of undesirable reflections from the boundary between the piezoelectric medium and the edge of the dampening material. It is advantageous to design the gasket so that any boundary line forms a predetermined angle with the fingers of the transducers as explained in U.S. Pat. No. 3,573,673, issued to DeVries et al, and assigned to the assignee of the present invention, and shown in FIG. 7 thereof. The preformed gasket has been die cut so that when aligned relative to pads 17 and 18, the projecting elements 25 and 26 may contact the surface wave device in a predetermined position.

During a heating cycle, these dampening elements are caused to sag to the surface of the device and subsequently bonded to provide end reflection attenuation. An alternative method of packaging includes the heat sagging and pressure tacking of the dampening elements so as to further insure proper alignment on the surface wave selective device. Using the preferred gasket material, this may be achieved by a temperature of 90°C and applying enough pressure to just contact the material to the surface of the device.

The gasket material comprises a random fibrous mat with a bonding material, normally an epoxy, dispersed within it. The preferred embodiment of this method uses a standard heat-activated preform sealing material such as a class-B-fiber-filled epoxy (one part system); a suitable product is manufactured and sold by Physical Sciences Corp. under the name DUROSEAL. However, other materials having similar properties may be used.

The actual physical interaction of the dampening elements is not completely known. When the dampening elements are in contact with the critical operational surface of the surface wave device, the contact point pattern thus formed is irregular because of the random fiber arrangement. It is believed that when the surface wave traveling on this surface encounters the region to which the dampening gasket has been bonded, it is attenuated by a combination of effects:

a. the surface wave is partly converted with different bulk modes or semi-surface wave modes by the presence of the layer;

b. the surface wave is scattered by the random structure of the fibers of the film thereby destroying the coherency of the scattered waves such that their components can produce significant undesired signals in the transducers;

c. the surface wave is partly attenuated because the fibrous material is lossy.

It is the combination of all these effects in the end region of the surface wave device which diminishes the end region reflection effects, thus reducing the signal interference at the output transducers. Experimentally, it has been observed that a 0.050 inch strip extending in the direction of propagation attenuates the undesirable surface wave components by more than 40 db. By fabricating the substrate such that the edge makes a predetermined angle with the transducer, a total reduction of the reflection of 50–70 db can be easily obtained.

A cover 35 is shown in FIG. 1 which overlies and contacts the gasket thus forming the closure for the recess. The dimensions of the cover are such as to allow the edge portions of the printed conductive areas to remain exposed after sealing. The cover may be of several materials either clear or opaque, but the preferred material lis ceramic. The cover is positioned relative to indexing pads 17 and 18 and then is bonded to the container plate by the preformed gasket, thus forming a hermetic seal.

The actual gasket sealing temperature cycle using the preferred gasket material consists of heating the assembled package at 215°C for forty minutes while under a pressure of approximately 50 grams per square inch applied to the cover. No pressure will, of course, be exerted on the dampening elements which bond to the critical surface during this cycle. The assembly is cooled and then annealed at 175°C for sixty minutes without applied pressure.

A method of packaging surface wave selective devices including a structure of such a packaged device which provides for electrical and mechanical interfacing with external circuit devices has been disclosed. A gasket is a part of the package structure providing end region attenuation of the surface waves.

Whereas the preferred form of the invention has been shown and described herein, it should be realized that there may be many modifications, substitutions and alterations thereto, without departing from the teachings of this invention.

What is claimed is:

1. A method for packaging a surface wave selective device to provide for convenient electrical and mechanical interfacing with associated circuit devices comprising:

printing electrically conductive material in patterned areas on a surface of a green ceramic plate, said areas extending to an edge thereof;

forming from said green ceramic plate a container defined by a major surface on which lie a plurality of conductive patterned areas extending from an edge thereof, a recess adapted to accommodate said tuned device and being electrically interconnected with said major surface by conductive material, and at least two distinctive reference locations positioned on adjacent sides of said recess;

heating said container to simultaneously cure the ceramic and fuse the electrically conductive material thereto;

securing said selective device within said recess;

establishing electrical interconnections from said tuned element to said electrically conductive areas;

providing a preformed gasket including a thermally responsive sealing material and having inwardly extending dampening elements;

placing said gasket in contact with said major surface and with said indexing pads with said dampening elements overlying said tuned device in predetermined alignment therewith;

placing a cured ceramic cover plate in contact with said gasket and said indexing pads; and heating the assembly above the bonding temperature of said sealing material causing activation thereof thus bonding said cover to said container and causing said integral dampening elements to bond to said tuned device to prevent undesirable end reflections in operation of said tuned device.

2. The method of claim 1, wherein the two distinctive reference locations comprise measurement indexing pads elevated above said major surface and positioned on adjacent sides of said recess.

3. The method as described in claim 1, wherein the placing of the preformed gasket in contact with the major surface of the cured ceramic container is followed by heat sagging and pressure tacking of said integral dampening elements to said tuned device.

4. A surface wave selective circuit device adapted for electrical and mechanical interfacing with associated circuit devices comprising:

a recessed ceramic container having a plurality of printed electrically conductive patterns including a ground plane on the bottom of the recess and conductive terminals extending from the recess along a predetermined surface of said ceramic container;

at least two distinctive reference locations located on said ceramic container providing measurement reference points for positioning a surface wave device within the recess;

a surface wave selective device, having input and output transducer terminals on an operational surface of a substrate of piezo-electric material, conductively bonded within said recess in a position providing clearance for said operational surface with the walls of said recess and with said opposed major surface electrically connected to said ground plane;

means for electrically connecting said input and output transducer terminals to said conductive terminals;

a preformed gasket in contact with said ceramic container and aligned with respect to said distinctive reference locations said gasket having inwardly extending dampening elements contacting the respective end regions of said operational surface of said selective device to provide controlled dampening of surface waves; and a ceramic cover plate in contact with said preformed gasket and sealed to said ceramic container to overlie said recess without contacting said surface wave selective device while permitting access to said conductive terminals to establish the required electrical connection to said surface wave selection device.

5. The selective circuit device as described in claim 4, wherein said preformed gasket comprises a mat of random fibrous material with a thermally responsive sealing material dispersed therein.

6. The selective circuit device as described in claim 4 wherein the edges of the dampening elements form a boundary line at a predetermined angle with the transducer fingers.

* * * * *